(12) United States Patent
Chen

(10) Patent No.: US 6,932,619 B2
(45) Date of Patent: Aug. 23, 2005

(54) TWIST CONTACT FOR ELECTRICAL CONNECTOR

(75) Inventor: Chen-Jung Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/957,177

(22) Filed: Sep. 30, 2004

(65) Prior Publication Data

US 2005/0070132 A1 Mar. 31, 2005

(30) Foreign Application Priority Data

Sep. 30, 2003 (TW) .................................. 92217521 U

(51) Int. Cl.⁷ ............................................... H01R 12/00
(52) U.S. Cl. .......................................... 439/66; 439/71
(58) Field of Search .......................... 439/70, 71, 862, 439/259, 266, 342, 66, 331

(56) References Cited

U.S. PATENT DOCUMENTS

| | | | |
|---|---|---|---|
| 5,167,512 A | * | 12/1992 | Walkup ........................ 439/66 |
| 5,518,410 A | * | 5/1996 | Masami ........................ 439/71 |
| 6,132,222 A | | 10/2000 | Wang et al. |
| 6,142,792 A | | 11/2000 | Yang |
| 6,247,938 B1 | * | 6/2001 | Rathburn ...................... 439/66 |
| 6,409,521 B1 | * | 6/2002 | Rathburn ...................... 439/66 |
| 6,791,345 B2 | * | 9/2004 | Maruyama et al. .......... 324/754 |

\* cited by examiner

*Primary Examiner*—Tho D. Ta
(74) *Attorney, Agent, or Firm*—Wei Te Chung

(57) ABSTRACT

A electrical contact, which is secured in a slot of a housing used to electrically connect a printed circuit board with a chip module comprises a tail portion mounted on the printed circuit board, a contact portion with a torsion portion based on the axis of the slot of the housing at least partly extending out of the slot contacting to the chip module and a base portion connected the tail portion with the contact portion. Thus, the space between the adjacent contacts will be improved to avoid the short circuit. Furthermore, even if the contacts are secured imprecisely, there will not be apt to form a short circuit between the adjacent contacts.

3 Claims, 3 Drawing Sheets

TWIST CONTACT FOR ELECTRICAL CONNECTOR

BACKGROUND OF THE INVENTION

1. Field of the Invention

The present invention relates to a contact for use in an electrical connector, especially a contact to connect a chip module with a printed circuit board.

2. Description of the Prior Art

With the development of computer technology, electrical sockets each of which mainly comprises an insulating housing and a plurality of contacts are becoming more and more smaller. On the other hand, the demand of high speed signal transmission results in more and more contacts used in the sockets. So, it will get some problems to arrange so many contacts in such limited area.

U.S. Pat. No. 6,142,792 discloses one conventional electrical socket. The socket comprises a dielectric housing and a plurality of contacts. The housing is formed with a plurality of slots. Each of the contacts comprises a base portion mounted in the slot, a contact portion extending from said base portion but not out of the slot for contacting a solder ball provided on a chip module and a tail portion extending from said base portion in the opposite direction. The contact portion formed with three branches gets a circle in order to contain the solder ball entirely. So it will make reliable electrical contacting between them. However, as the contact portion doesn't extend out of the housing, the solder ball must be configured to enter into the slot and take up huge room. As a result, the pitch of adjacent contacts increases, and the amount of contacts decrease accordingly. Therefore, this type of socket doesn't meet the needs of high speed signal transmission.

Hence, a type of improved contact for use in an electrical socket is required to overcome the disadvantage of the prior art.

SUMMARY OF THE INVENTION

Accordingly, an object of the present invention is to provide a contact for use in an electrical connector. It will not only provide reliable cooperation between the contact and the solder ball, but also come into being a simple configuration. Furthermore, for high density connector, it will also provide enough space to arrange more contacts in said housing to meet the needs of high speed signal transmission. The present invention is to provide a type of contact with furcated contact portion, which can increase the contacting area for better transmission.

To achieve the above objects, the present invention is to provide a type of contact placed in a housing which comprises a tail portion mounted on the printed circuit board, a contact portion with a torsion portion based on the axis of the slot of the housing at least partly extending out of the slot contacting to the chip module and a base portion connected the tail portion with the contact portion.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
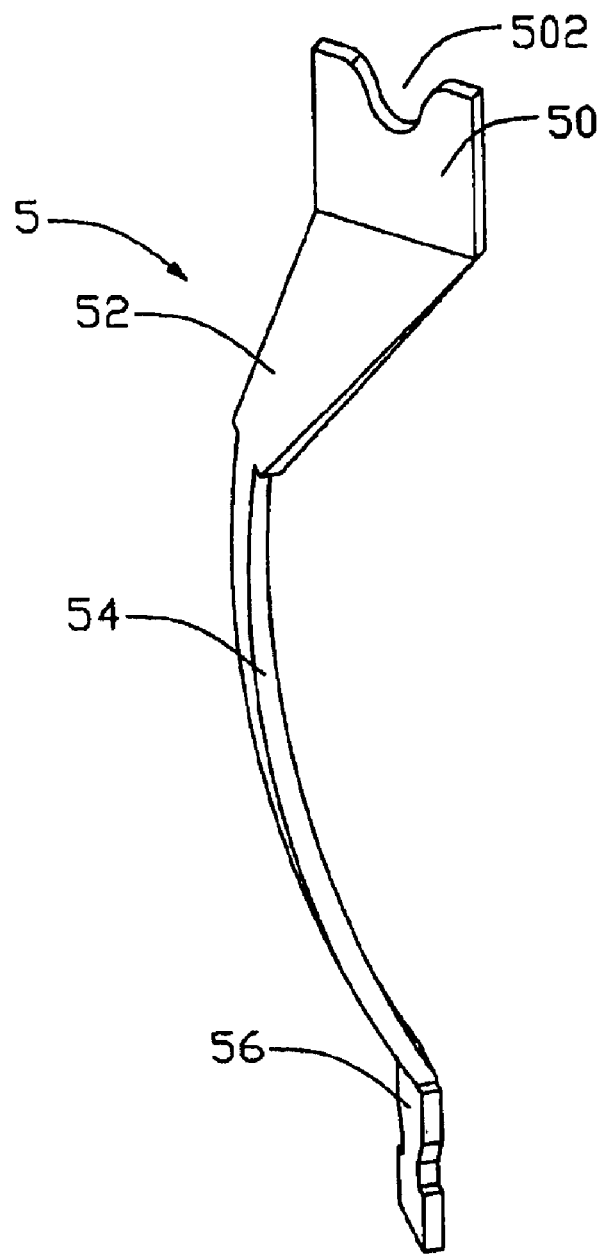
FIG. 1 is a perspective view of an electrical contact according to the present invention.
Figure 2:
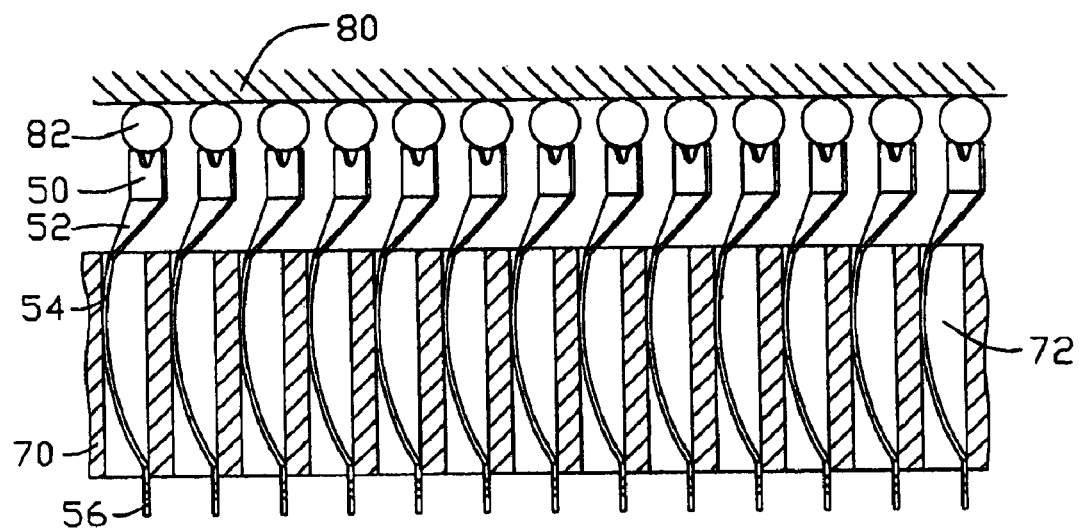
FIG. 2 is a cross-sectional view showing plural contacts of FIG. 1 are mounted in a housing and contact with solder balls of a chip module.
Figure 3:
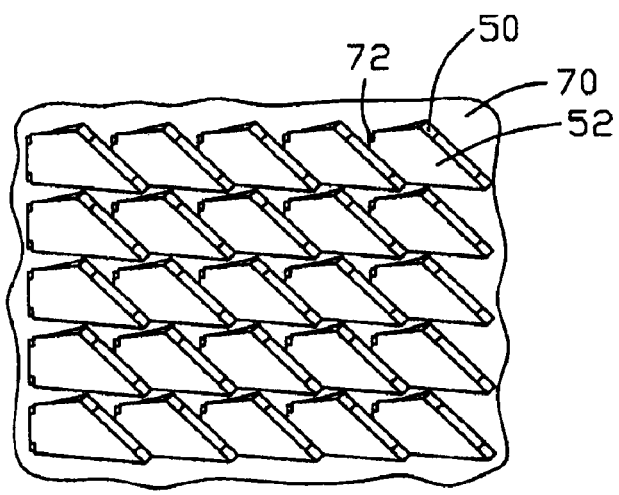
FIG. 3 is a top view showing the contacts mounted in the housing are free.

Referring to FIGS. 1, 2 and 3, a plurality of contact 5 according to present invention is arranged in slots 72 defined in an insulative housing 70 of an electrical socket (not labeled) which is adapted for connecting a chip module 80 with a Printed Circuit Board (PCB) (not shown). Each contact 5 comprises a contact portion 50 shaped in plate for contacting with corresponding solder ball 84 of the chip module 80, a tail portion 56 for being mounted on the PCB and a curving base portion 54, by which the contact 5 was hold in the slot 72 of the housing 70, located between said contact portion 50 and said tail portion 56. The contact portion 50 is formed in a Y-shape with a gap 502 defined thereon. A torsion portion 52 shaped like a triangle extends from the contact portion 50 to the curving base portion 54. While mounted in the slot 72, the contact portion 50 and the torsion portion 52 extends beyond a mating face of the electrical socket. The contact portion 50 together with the torsion portion 52 is turned an angle of 45 degree on axis of the slot 72 in the present embodiment, whereby the contact portion 50 is just parallel to a diagonal direction of the insulative housing 70 which forms a square shape. Thus, the space between the adjacent contacts will be improved to avoid the short circuit between the adjacent contacts 5. Furthermore, even if the contacts 5 are secured imprecisely, there will not be apt to establish a short circuit between the adjacent contacts. In other words, more contacts 5 will be allowed to be disposed in the housing while pressed in the same condition, thereby improving the speed of the signal transmission.

As the contact aforementioned, the contact portion 50 turned an angle of 45 degree is the best embodiment to meet the need of the present invention. It is also acceptable to turn the contact portion 50 other certain degree to achieve the substantially similar effect as 45 degree. In practice, it had better keep a certain angle between 30 degree and 60 degree, and it will get the same effect to keep 30 degree or to keep 60 degree while the contact portion 50 is turned relative to the base portion 54.

Figure 4:
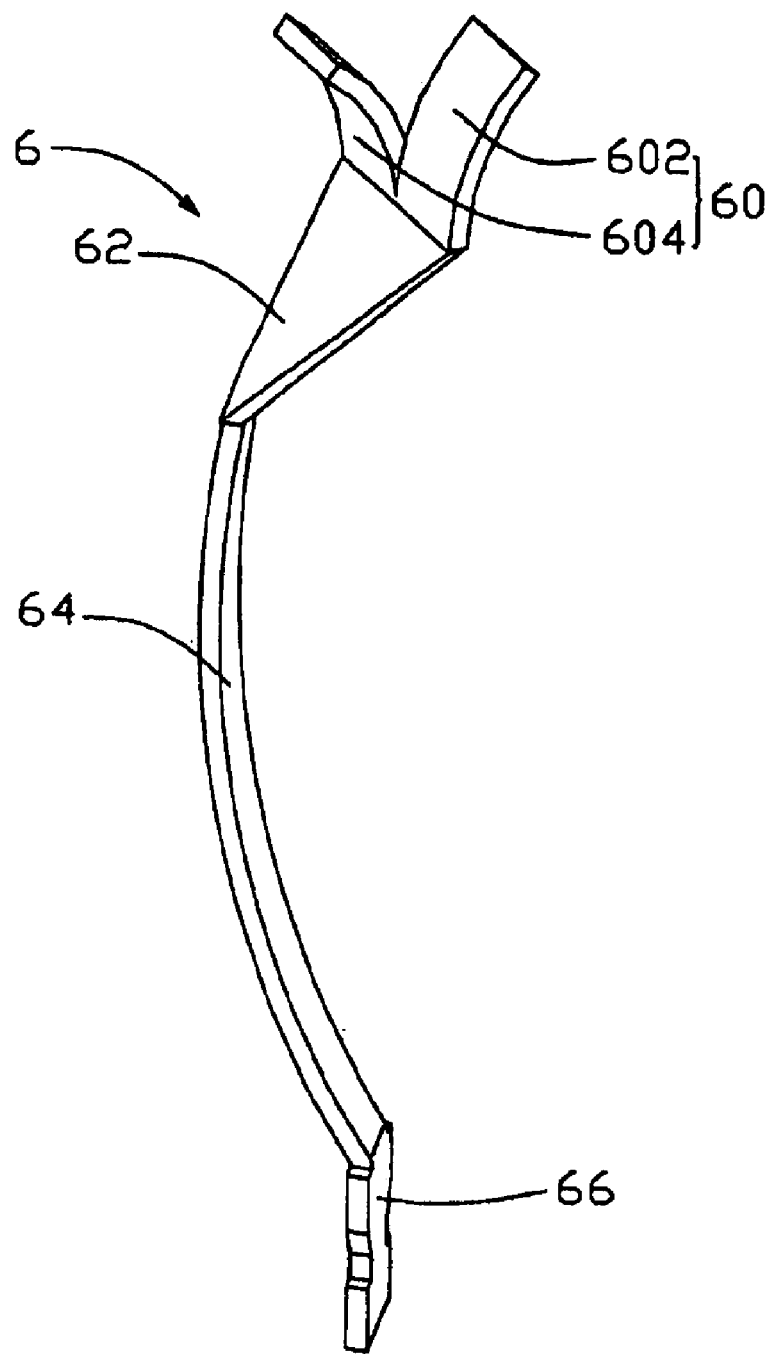
FIG. 4 is a perspective view of an electrical contact according to another embodiment of the present invention.

Referring to FIG. 4, it shows another type of contact according to the present invention.

Each contact comprises a contact portion 60, a tail portion 66 mounted on the printed circuit board and a curving base portion 64. A torsion portion 62 is defined to connect the contact portion 60 with the base portion 64. which turns 45 degree based on the axis of the slot 72 of the housing 70. The difference is that the contact portion 60 of this type of contact further comprises a forfication formed with a first piece 602 and a second piece 604. In this way, it can provides a tridimensional contact between the contact portion 60 and the solder ball which can increase the contacting area and strengthen the clamping force. Accordingly, it will provides a better way for signal transmission.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical contact adapted for being secured in a slot of a housing and being used to electrically connect a printed circuit board with a chip module comprising:

a tail portion being mounted on the printed circuit board;

a contact portion comprising a torsion portion twisted with respected to an axis of the slot of the housing and extending out of the slot for contacting the chip module; and a base portion connecting the tail portion with the contact portion;

wherein the torsion portion turns an angle of 45 degree with respect to the axis of the slot of the housing;

wherein the contact portion is almost in the direction of the diagonal of the slot which forms a square shape;

wherein the contact portion is used to electrically contact a solder ball provided on the chip module;

wherein the base portion is formed with a curve.

2. The electrical contact as claimed in claim 1, wherein the contact portion comprises a forfication formed with a first piece and a second piece.

3. An electrical socket comprising:

an insulative housing defining therein a plurality of passageways extending along a vertical direction;

a plurality of contacts assembled to the housing and arranged in matrix on a first plane defined by row and column directions perpendicular to each other and to said vertical direction;

each of said contacts including:

a curving base portion disposed in the corresponding passageways, respectively, said curving base portion essentially moveably extending along a second plane which is defined by the vertical direction and the row direction and is perpendicular to said first plane, so that said curving base portion is deemed perpendicular to said second plane;

a contact portion exposed above an upper face of the housing for contacting a conductive ball of an electronic device located upon the housing, and defining a main plane which is oblique at an angle range from 30 degree to 60 degree to said second plane while is perpendicular to said first plane; and a transition portion connected between the base portion and the contact portion;

wherein said transition portion is essentially of a twisted type.

* * * * *